(12) United States Patent
Togashi

(10) Patent No.: US 8,089,284 B2
(45) Date of Patent: Jan. 3, 2012

(54) IMPEDANCE MEASURING METHOD

(75) Inventor: Masaaki Togashi, Tokyo (JP)

(73) Assignee: TDK Corporation, Tokyo (JP)

( * ) Notice: Subject to any disclaimer, the term of this patent is extended or adjusted under 35 U.S.C. 154(b) by 393 days.

(21) Appl. No.: 12/479,282

(22) Filed: Jun. 5, 2009

(65) Prior Publication Data

US 2009/0322348 A1  Dec. 31, 2009

(30) Foreign Application Priority Data

Jun. 30, 2008 (JP) ................................. 2008-170941

(51) Int. Cl.
*G01R 31/12* (2006.01)
*G01R 31/08* (2006.01)
(52) U.S. Cl. ........................................ 324/548; 324/525
(58) Field of Classification Search .................. 324/548, 324/525
See application file for complete search history.

(56) References Cited

U.S. PATENT DOCUMENTS 4,931,720 A * 6/1990 Garbe et al. .................. 324/627
7,839,151 B2 * 11/2010 Kurita et al. .................. 324/548

FOREIGN PATENT DOCUMENTS

JP   A-2001-13186   1/2001

* cited by examiner

*Primary Examiner* — Amy He
(74) *Attorney, Agent, or Firm* — Oliff & Berridge, PLC

(57) ABSTRACT

An impedance measuring method uses an impedance measuring device for measuring an impedance of a measured electronic component, a coaxial connector electrically connected to the impedance measuring device, and a measurement substrate which can be housed in the coaxial connector. The coaxial connector has a center conductor and an outer conductor located outside the center conductor. The measurement substrate has an insulating substrate and first and second conductors each formed on a first principal surface of the insulating substrate. The measurement substrate with the measured electronic component being mounted on the first and second conductors is housed in the coaxial connector connected to the impedance measuring device, so as to electrically connect the first conductor to the center conductor and electrically connect the second conductor to the outer conductor. Then the impedance of the measured electronic component is measured by the impedance measuring device.

5 Claims, 14 Drawing Sheets

IMPEDANCE MEASURING METHOD

BACKGROUND OF THE INVENTION

1. Field of the Invention

The present invention relates to an impedance measuring method using an impedance measuring device to which a coaxial connector is connected.

2. Related Background Art

There is a known impedance measuring method using an impedance measuring device for measuring an impedance of an electronic component to be measured (which will be referred to as a measured electronic component), a coaxial connector having a center conductor and an outer conductor located outside the center conductor, and being electrically connected to the impedance measuring device, and a measurement jig connected to the coaxial connector, and the method is arranged to measure the impedance of the measured electronic component fixed to the measurement jig (e.g., cf. Patent Document 1: Japanese Patent Application Laid-open No. 2001-013186). In the impedance measuring method described in Patent Document 1 (Laid-open No. 2001-013186), the measured electronic component is sandwiched between the measurement jig and a biasing attachment jig to be fixed to the measurement jig.

SUMMARY OF THE INVENTION

However, the impedance measuring method described in Patent Document 1 has the following problem. Namely, the impedance measuring method described in Patent Document 1 involves the arrangement in which the measured electronic component is sandwiched between the measurement jig and the biasing attachment jig, and this arrangement increases the contact resistance between the measurement jig and the measured electronic component and the contact resistance between the biasing attachment jig and the measured electronic component. This could lead to a failure in appropriately measuring the impedance characteristic of the measured electronic component. Outer surfaces of external terminal electrodes of electronic components are often of a curved shape and in this case, the measured electronic component (external terminal electrodes) is kept in point contact with the measurement jig or the biasing attachment jig, which further increases the contact resistance.

If the contact condition varies between the measured electronic component (external terminal electrodes) and the measurement jig or the biasing attachment jig, the contact resistance could change between the measurement jig and the measured electronic component or between the biasing attachment jig and the measured electronic component. In this case, reproducibility will be poor for the contact resistance among measurements and there will be variation in measurement results.

An object of the present invention is to provide an impedance measuring method enabling highly accurate measurement by decreasing the contact resistance with the measured electronic component and thereby suppressing occurrence of the measurement variation due to the contact resistance.

The present invention provides an impedance measuring method using an impedance measuring device for measuring an impedance of a measured electronic component; a coaxial connector having a center conductor and an outer conductor located outside the center conductor, and being electrically connected to the impedance measuring device; and a measurement substrate which can be housed in the coaxial connector, the measurement substrate having an insulating substrate, and first and second conductors each formed on a first principal surface of the insulating substrate, the impedance measuring method comprising: housing the measurement substrate with the measured electronic component being mounted on the first and second conductors, in the coaxial connector connected to the impedance measuring device, so that the first conductor is electrically connected to the center conductor and so that the second conductor is electrically connected to the outer conductor; and measuring the impedance of the measured electronic component by the impedance measuring device.

In the impedance measuring method according to the present invention, the measured electronic component is mounted on the first and second conductors of the measurement substrate thereby to be fixed to the measurement substrate, and for this reason, no contact resistance is produced between the measured electronic component and the measurement substrate. This method also suppresses occurrence of the measurement variation due to the contact resistance. As a consequence of these, the present invention permits highly accurate measurement of the impedance characteristic.

Preferably, the measurement substrate further has a third conductor and a fourth conductor each formed on a second principal surface of the insulating substrate, the third conductor is electrically connected through a throughhole conductor to the first conductor, and the fourth conductor is electrically connected through a throughhole conductor to the second conductor; the measurement substrate is housed in the coaxial connector so as to make the second principal surface opposed to the center conductor and the outer conductor and keep the third conductor in surface contact with the center conductor and the fourth conductor in surface contact with the outer conductor, whereby the first conductor is electrically connected through the third conductor to the center conductor and whereby the second conductor is electrically connected through the fourth conductor to the outer conductor. In this case, the measured electronic component is mounted on the first principal surface side where it does not face the coaxial connector (center conductor and outer conductor), which prevents contact between the measured electronic component and the coaxial connector. This arrangement surely prevents a short circuit between the center conductor and the outer conductor. Since the measured electronic component does not exist on the second principal surface side, it does not interfere with contact between the third conductor and the center conductor and contact between the fourth conductor and the outer conductor. This results in ensuring secure contact between the third conductor and the center conductor and secure contact between the fourth conductor and the outer conductor.

A contact resistance is produced between the third conductor and the center conductor and between the fourth conductor and the outer conductor. However, the third conductor is in surface contact with the center conductor and the fourth conductor is in surface contact with the outer conductor; therefore, the contact resistance produced is relatively small and variation thereof is also small. As a result of this, influence on the measurement of impedance characteristic is extremely small and degradation of measurement accuracy is restrained.

Preferably, the method uses a fixture to mesh with the coaxial connector, and the second conductor is pushed by the fixture. In this case, it is feasible to further decrease the variation in the contact resistance between the third conductor and the center conductor and the variation in the contact resistance between the fourth conductor and the outer conductor.

Preferably, an insulating coating is formed on the first principal surface side of the measurement substrate, and the insulating coating has apertures formed so as to expose portions in the first and second conductors where the measured electronic component is to be mounted. In this case, the measured electronic component can be readily positioned during mounting the measured electronic component on the measurement substrate.

Preferably, the impedance measuring method further uses a short substrate having a shape similar to that of the measurement substrate, in which a short circuit is made between a conductor corresponding to the first conductor and a conductor corresponding to the second conductor, the impedance measuring method comprising: housing the short substrate in the coaxial connector so that the conductor corresponding to the first conductor is electrically connected to the center conductor and so that the conductor corresponding to the second conductor is electrically connected to the outer conductor; and performing short calibration in the impedance measuring device. In this case, the result of the short calibration is appropriately reflected in execution of the impedance measurement of the measured electronic component. As a result of this, the impedance characteristic of the measured electronic component can be measured with higher accuracy.

The present invention successfully provides the impedance measuring method enabling the highly accurate measurement by decreasing the contact resistance with the measured electronic component and thereby suppressing occurrence of the measurement variation due to the contact resistance.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. In the description, the same elements or elements with the same functionality will be denoted by the same reference symbols, without redundant description.

Figure 1:
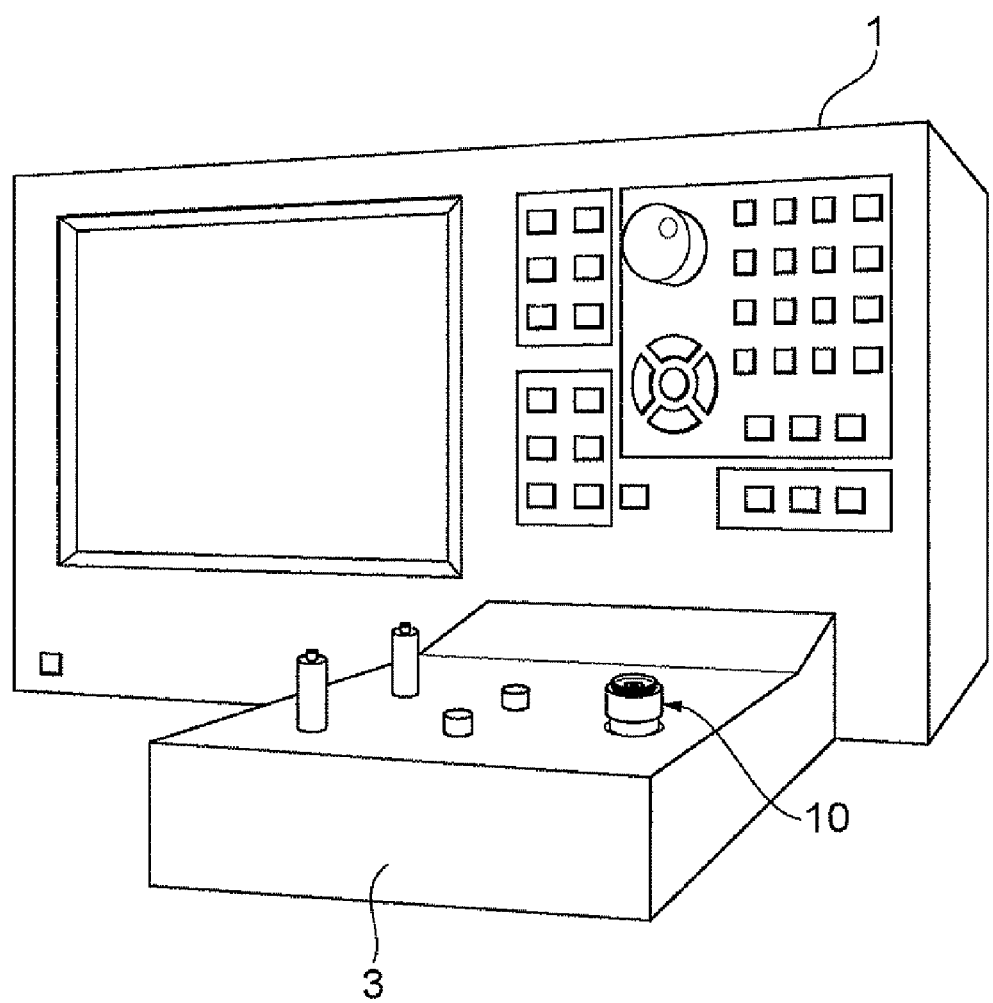
FIG. 1 is a drawing showing an impedance measuring device used in an impedance measuring method according to an embodiment of the present invention.

In an impedance measuring method according to an embodiment of the present invention, an impedance measuring device 1 and a coaxial connector 10 are first prepared as shown in FIG. 1. The impedance measuring device 1 is an instrument to measure the impedance of a measured electronic component. In the present embodiment, the impedance measuring device 1 used is E4991A RF Impedance/Material Analyzer (available from Agilent Technologies Japan, Ltd.). The impedance measuring device 1 includes a test head unit 3 for impedance measurement. The test head unit 3 is connected to a test head interface of the impedance measuring device 1.

Figure 2:
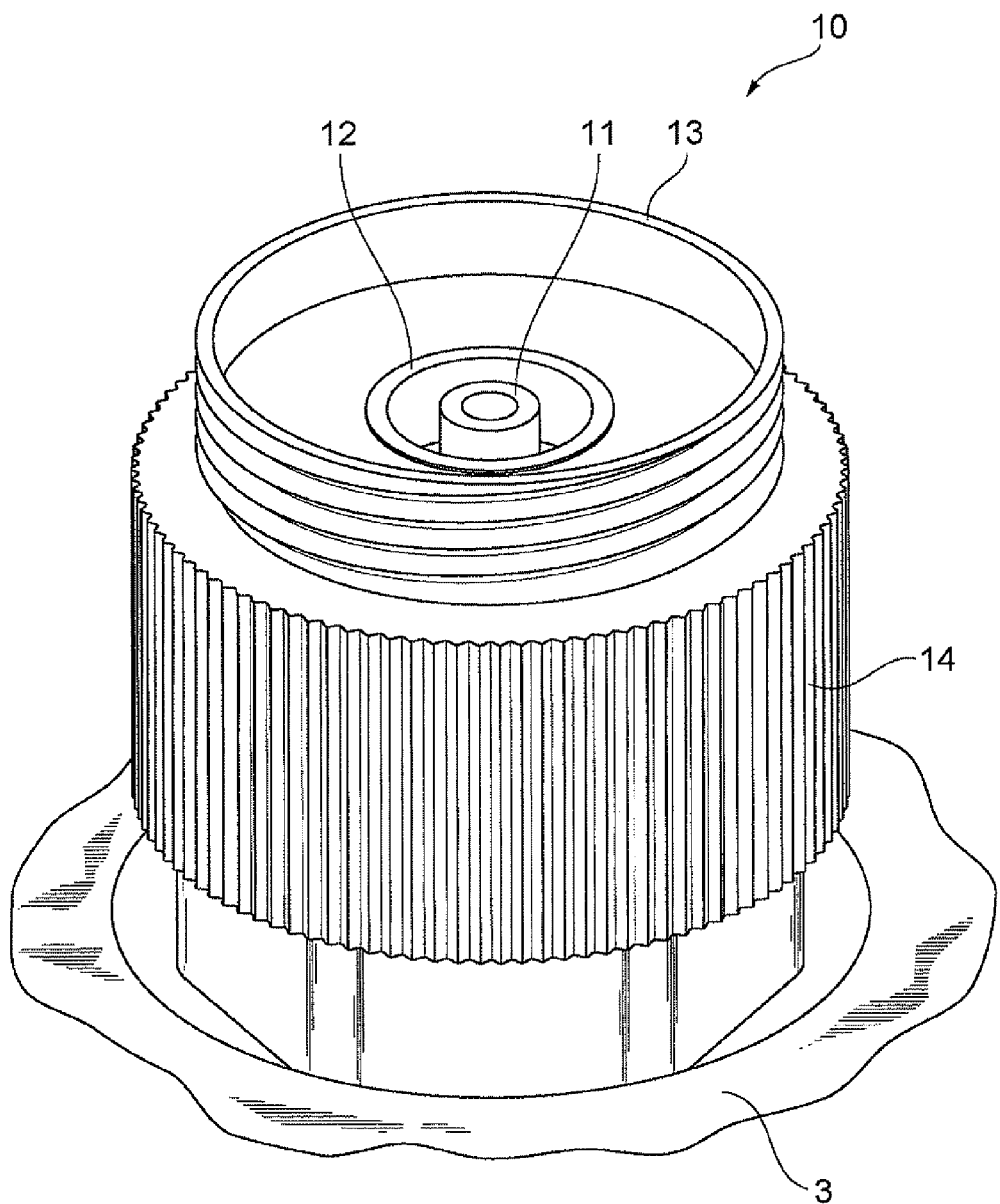
FIG. 2 is a perspective view showing a coaxial connector used in the impedance measuring method according to the embodiment.

The coaxial connector 10 is arranged in the test head unit 3 and is electrically connected to the impedance measuring device 1. The coaxial connector 10, as shown in FIG. 2, has a center conductor 11, an outer conductor 12 located outside the center conductor 11, a sleeve 13 located outside the outer conductor 12, and a connector nut 14 meshing with the sleeve 13. The end of the center conductor 11 is more projecting in the direction of the center axis of the center conductor 11 than the end of the outer conductor 12. In the present embodiment, the coaxial connector 10 used is APC (Amphenol Precision Connector)-7 available from Amphenol Corporation. The coaxial connector 10 functions as a test port and has the characteristic impedance of 50 Ω.

Figure 3:
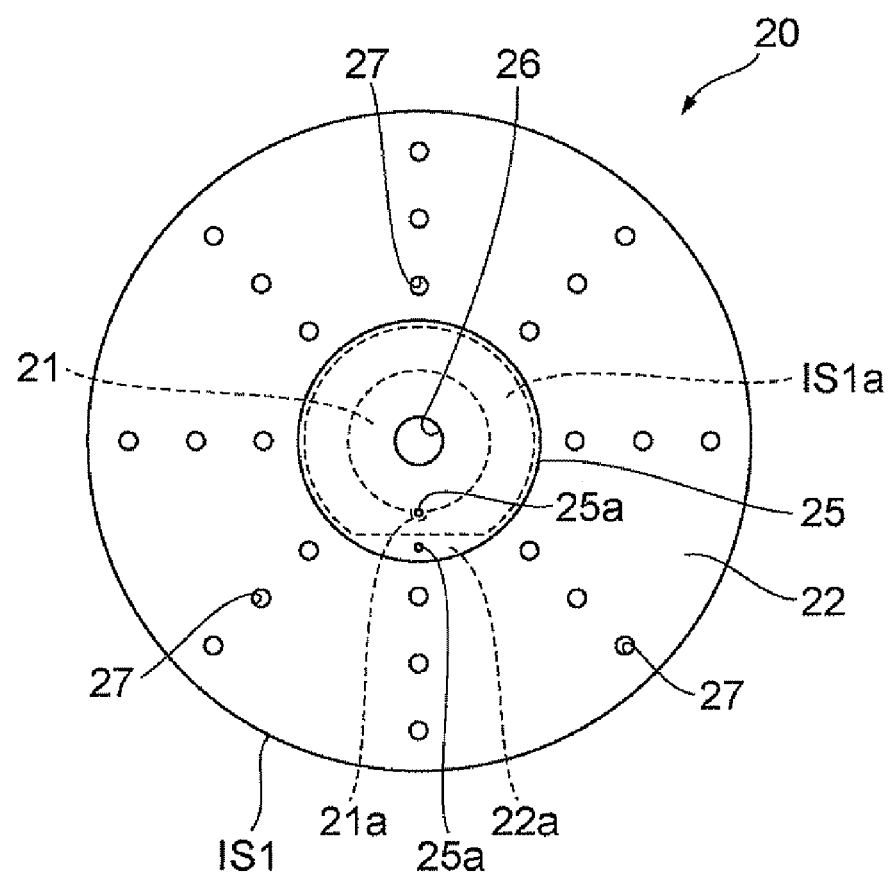
FIG. 3 is a plan view showing a measurement substrate used in the impedance measuring method according to the embodiment.
Figure 4:
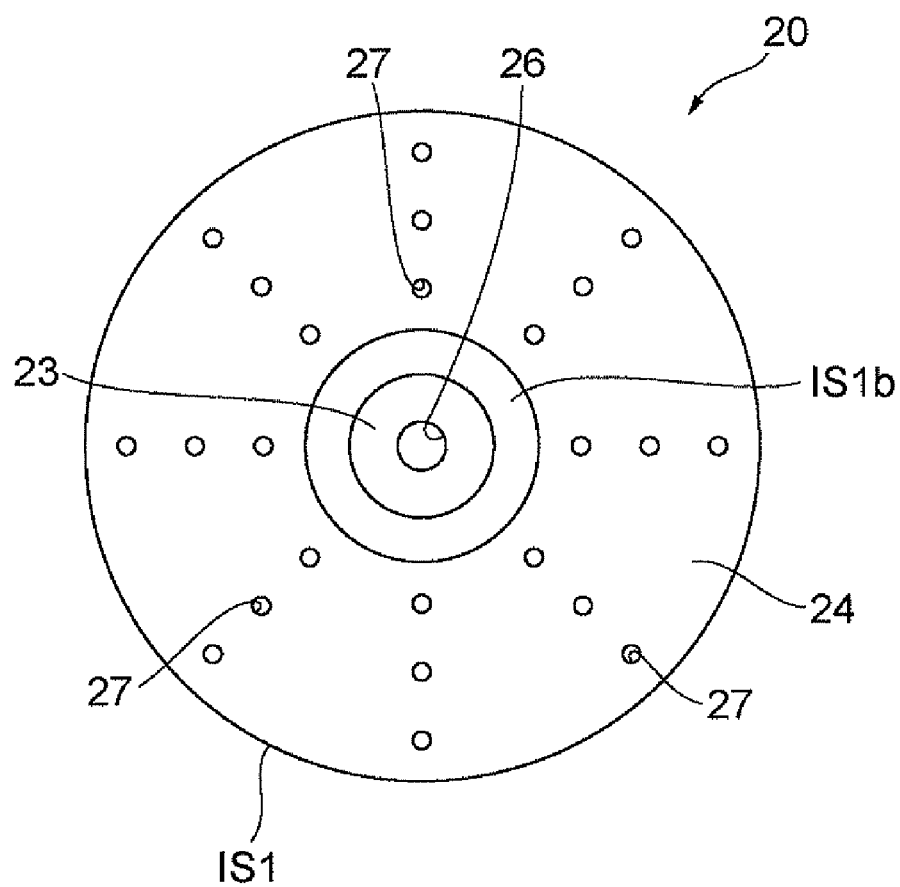
FIG. 4 is a plan view showing the measurement substrate used in the impedance measuring method according to the embodiment.
Figure 5:
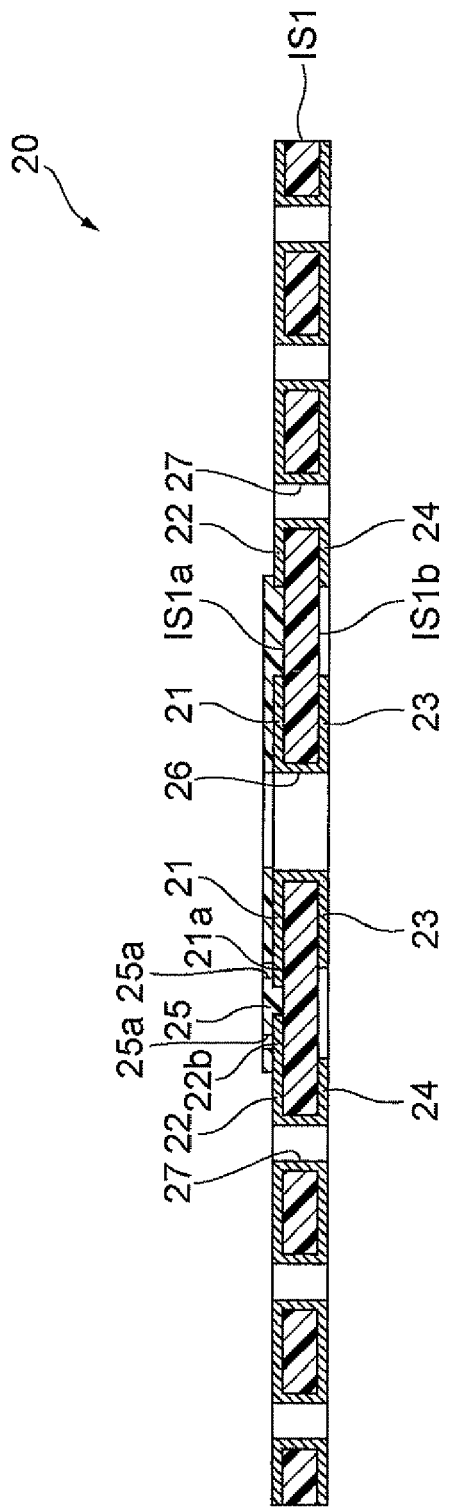
FIG. 5 is a sectional view showing the measurement substrate used in the impedance measuring method according to the embodiment.

In the impedance measuring method of the present embodiment, a measurement substrate 20 is prepared as shown in FIGS. 3 to 5. The measurement substrate 20 has an insulating substrate IS1, first to fourth conductors 21-24, and throughhole conductors 26, 27. The insulating substrate IS1 is of a disc shape and is made of an electrically insulating material (e.g., a glass epoxy material or the like). The insulating substrate IS1 has a first principal surface IS1$a$ and a second principal surface IS1$b$ opposed to each other.

The outside diameter of the insulating substrate IS1 is set to be smaller than the inside diameter of the sleeve 13 of the coaxial connector 10. This permits the insulating substrate IS1 to be housed in the sleeve 13 of the coaxial connector 10. The first to fourth conductors 21-24 and throughhole conductors 26, 27 are made, for example, of copper or the like. In the present embodiment, the outside diameter of the insulating substrate IS1 is approximately 14 mm and the thickness thereof approximately 0.3 mm.

The first and second conductors 21, 22 are formed on the first principal surface IS1$a$ of the insulating substrate IS1 and electrically insulated from each other on the first principal surface IS1$a$. The first conductor 21 is of a nearly circular shape and is located in a central region of the insulating substrate IS1 The first conductor 21 includes a mounting portion 21a on which the measured electronic component is to be mounted. The second conductor 22 is concentrically located outside the first conductor 21 and with a predetermined space from the first conductor 21. The second conductor 22 includes a mounting portion 22a on which the measured electronic component is to be mounted.

The measured electronic component is mounted on the mounting portions 21a, 22a by soldering or the like. In a state in which the measured electronic component is mounted on the mounting portions 21a, 22a, terminal electrodes of the measured electronic component are electrically and physically connected to the respective mounting portions 21a, 22a.

An insulating coating 25 is formed on the measurement substrate 20 so as to cover the first conductor 21 and an inside portion of the second conductor 22. The insulating coating 25 is, for example, made of a photoresist material or the like. The insulating coating 25 has apertures 25a formed so as to expose the mounting portions 21a, 22a.

The third and fourth conductors 23, 24 are formed on the second principal surface IS1b of the insulating substrate IS1 and are electrically insulated from each other on the second principal surface IS1b. The third conductor 23 is of a nearly circular shape and is located in a central region of the insulating substrate IS1. The fourth conductor 24 is concentrically located outside the third conductor 23 and with a predetermined space from the third conductor 23.

The first conductor 21 and the third conductor 23 are electrically connected to each other through the throughhole conductor 26 formed in the insulating substrate IS1. The throughhole conductor 26 is located in a central region of the insulating substrate IS1. The second conductor 22 and the fourth conductor 24 are electrically connected to each other through a plurality of throughhole conductors 27 formed in the insulating substrate IS1. The plurality of throughhole conductors 27 are radially located from the central region of the insulating substrate IS1.

A production method of the insulating substrate IS1 will be described below. A matrix substrate is first prepared. The matrix substrate consists of a substrate of an insulating material (e.g., a glass epoxy material or the like), and conductor layers formed on both sides of this substrate. The conductor layers can be formed by electroless plating with a metal material (e.g., copper or the like). Then the matrix substrate thus prepared is perforated to form throughholes at positions corresponding to the positions where the throughhole conductors 26, 27 are formed.

Next, conductor layers are formed on internal surfaces of the throughholes by electroless plating with a metal material (e.g., copper or the like). The conductor layers on the internal surfaces of the throughholes are formed so as to be continuous to the conductor layers formed on the both surfaces of the matrix substrate. This process results in forming the throughhole conductors 26, 27.

Next, the conductor layers formed on the both surfaces of the matrix substrate are patterned by the photolithography technology. This patterning results in forming the first to fourth conductors 21-24. Then, the insulating coating 25 is formed on the first and second conductors 21, 22 by patterning. Thereafter, the matrix substrate is cut to obtain an individual measurement substrate 20.

Figure 6:
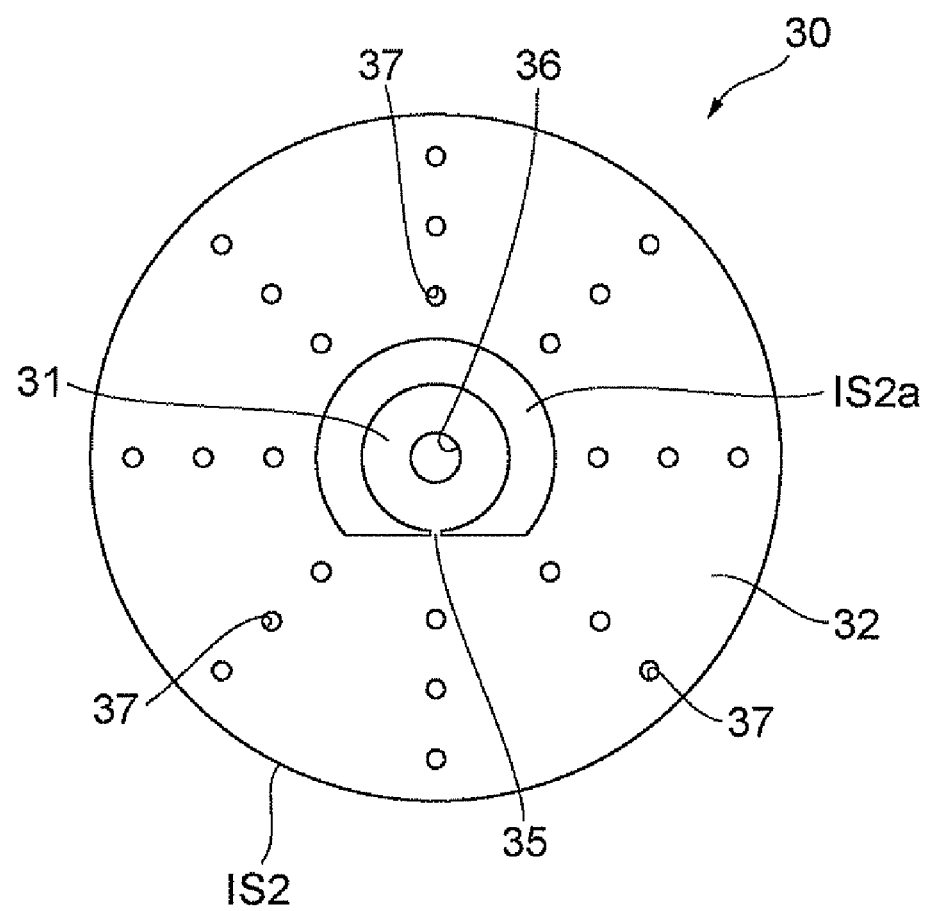
FIG. 6 is a plan view showing a short substrate used in the impedance measuring method according to the embodiment.
Figure 7:
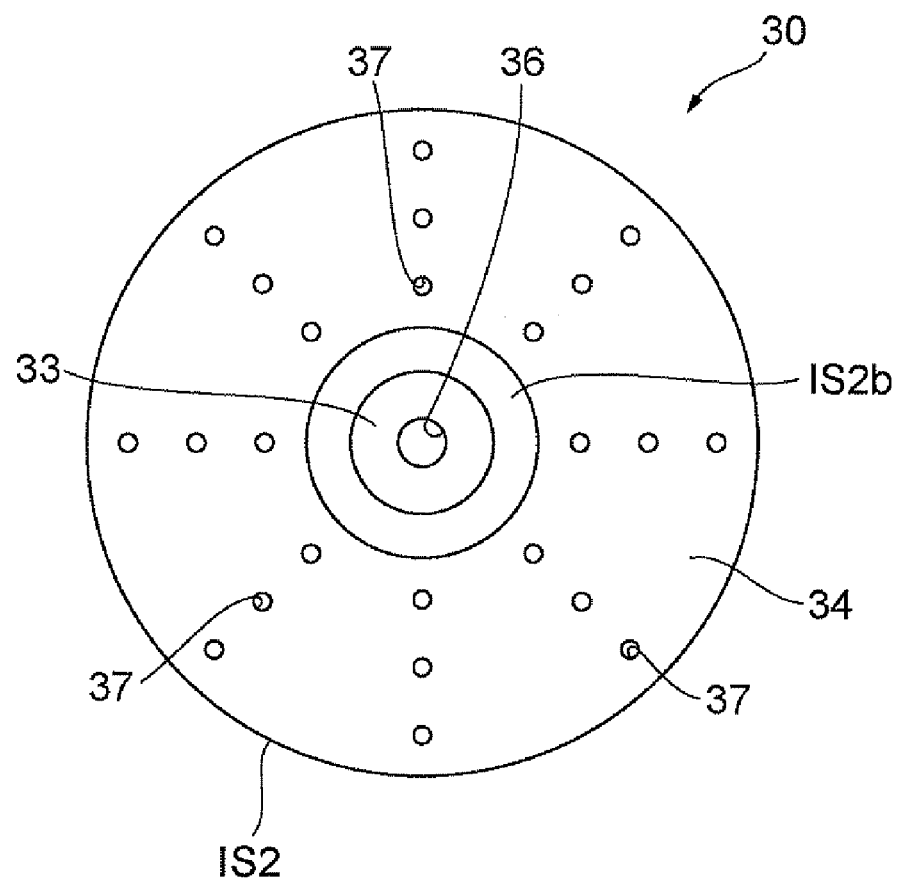
FIG. 7 is a plan view showing the short substrate used in the impedance measuring method according to the embodiment.
Figure 8:
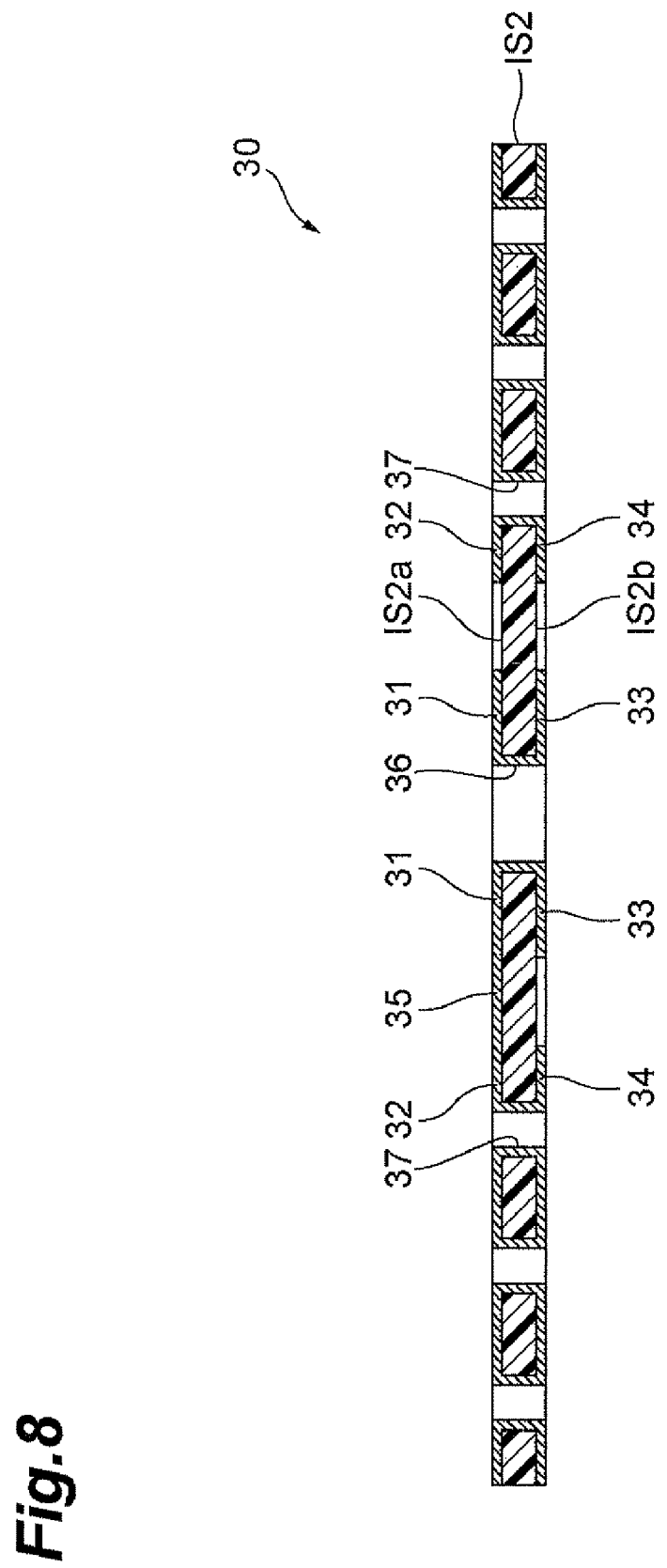
FIG. 8 is a sectional view showing the short substrate used in the impedance measuring method according to the embodiment.

Now, let us explain a short substrate 30 used in short calibration of the impedance measuring device 1, with reference to FIGS. 6 to 8. The short substrate 30 has a shape similar to that of the measurement substrate 20. A production method of the short substrate 30 is similar to that of the measurement substrate 20 described above, and thus the description thereof is omitted herein.

The short substrate 30 has an insulating substrate IS2, first to fifth conductors 31-35, and throughhole conductors 36, 37. The insulating substrate IS2 is of a disc shape and is made of an electrically insulating material (e.g., a glass epoxy material or the like). The insulating substrate IS2 has a first principal surface IS2a and a second principal surface IS2b opposed to each other.

The outside diameter of the insulating substrate IS2 is approximately equal to the outside diameter of the insulating substrate IS1 and is set to be smaller than the inside diameter of the sleeve 13 of the coaxial connector 10. This also permits the insulating substrate IS2 to be housed in the sleeve 13 of the coaxial connector 10 as is the case with the insulating substrate IS1. The first to fifth conductors 31-35 and throughhole conductors 36, 37 are made, for example, of copper or the like. In the present embodiment, the outside diameter of the insulating substrate IS2 is approximately 14 mm and the thickness thereof approximately 0.3 mm.

The first and second conductors 31, 32 are formed on the first principal surface IS2a of the insulating substrate IS2. The first conductor 31 is of a nearly circular shape and is located in a central region of the insulating substrate IS2. The second conductor 32 is concentrically located outside the first conductor 31 and with a predetermined space from the first conductor 31. The first conductor 31 and the second conductor 32 are connected by the fifth conductor 35 to be electrically connected to each other. Namely, the first conductor 31 and the second conductor 32 are short-circuited. The first conductor 31, second conductor 32, and fifth conductor 35 are integrally formed.

The third and fourth conductors 33, 34 are formed on the second principal surface IS2b of the insulating substrate IS2 and are electrically insulated from each other on the second principal surface IS2b. The third conductor 33 is of a nearly circular shape and is located in a central region of the insulating substrate IS2. The fourth conductor 34 is concentrically located outside the third conductor 33 and with a predetermined space from the third conductor 33.

The first conductor 31 and the third conductor 33 are electrically connected to each other through the throughhole conductor 36 formed in the insulating substrate IS2. The throughhole conductor 36 is located in a central region of the insulating substrate IS2. The second conductor 32 and the fourth conductor 34 are electrically connected to each other through a plurality of throughhole conductors 37 formed in the insulating substrate IS2. The plurality of throughhole conductors 37 are radially located from the central region of the insulating substrate IS2.

The first conductor 31 of the short substrate 30 is almost the same shape as the first conductor 21 of the measurement substrate 20 and they correspond to each other. The second conductor 32 of the short substrate 30 is almost the same shape as the second conductor 22 of the measurement substrate 20 and they correspond to each other. The third conductor 33 of the short substrate 30 is almost the same shape as the third conductor 23 of the measurement substrate 20 and they correspond to each other. The fourth conductor 34 of the short substrate 30 is almost the same shape as the fourth conductor 24 of the measurement substrate 20 and they correspond to each other.

Figure 9:
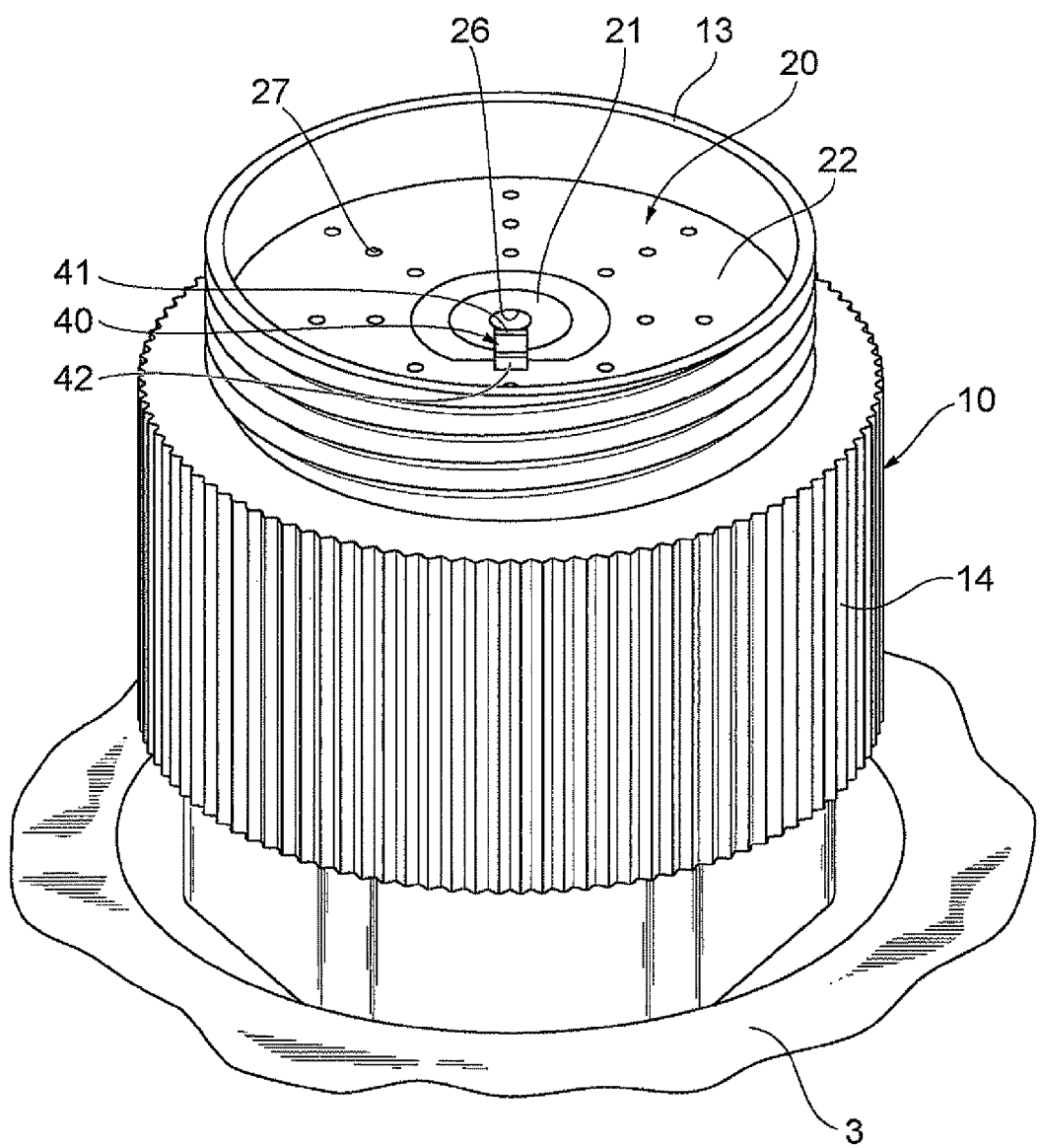
FIG. 9 is a perspective view showing a state in which the measurement substrate is housed in the coaxial connector.
Figure 11:
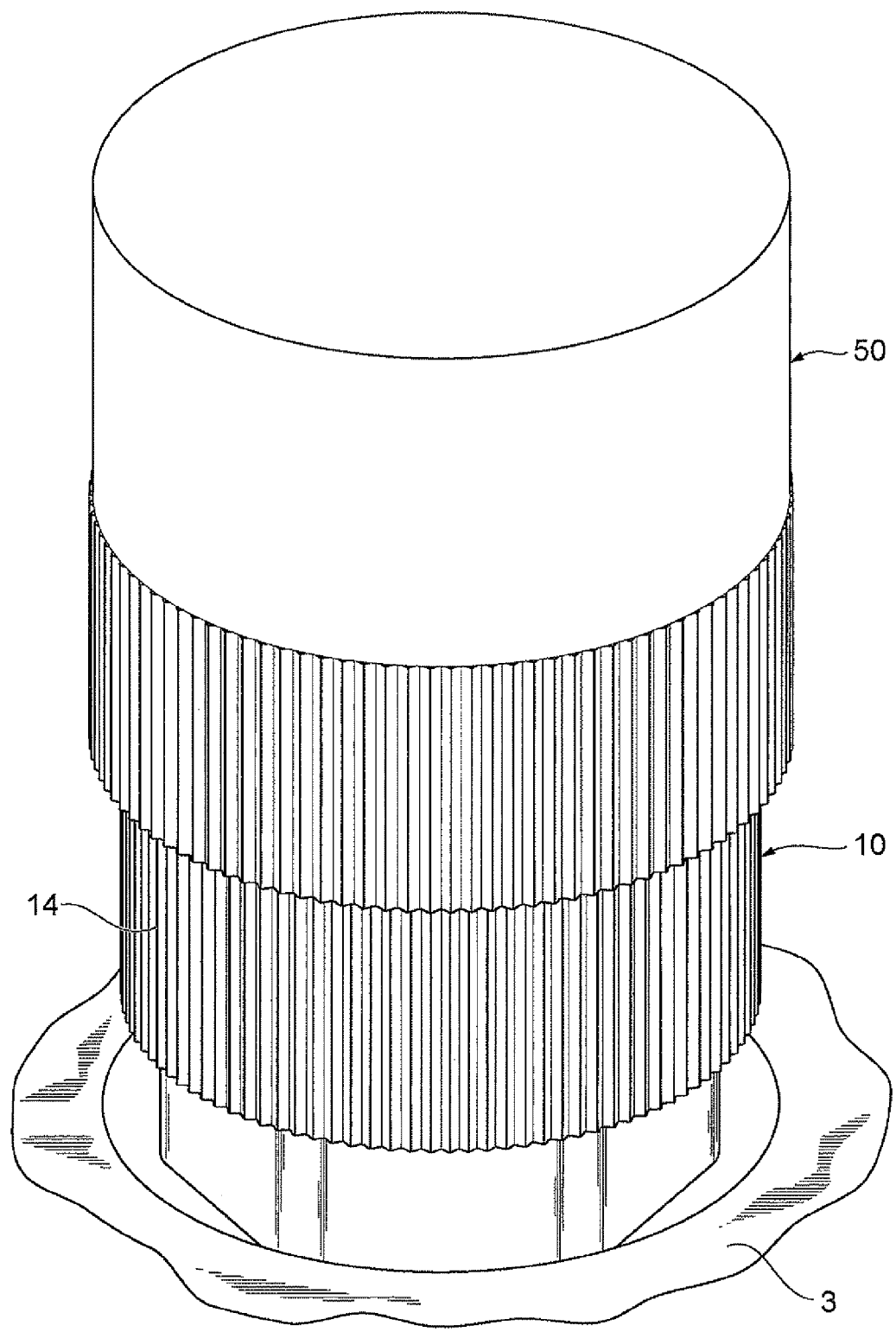
FIG. 11 is a perspective view showing a state in which a fixture meshes with the coaxial connector.
Figure 12:
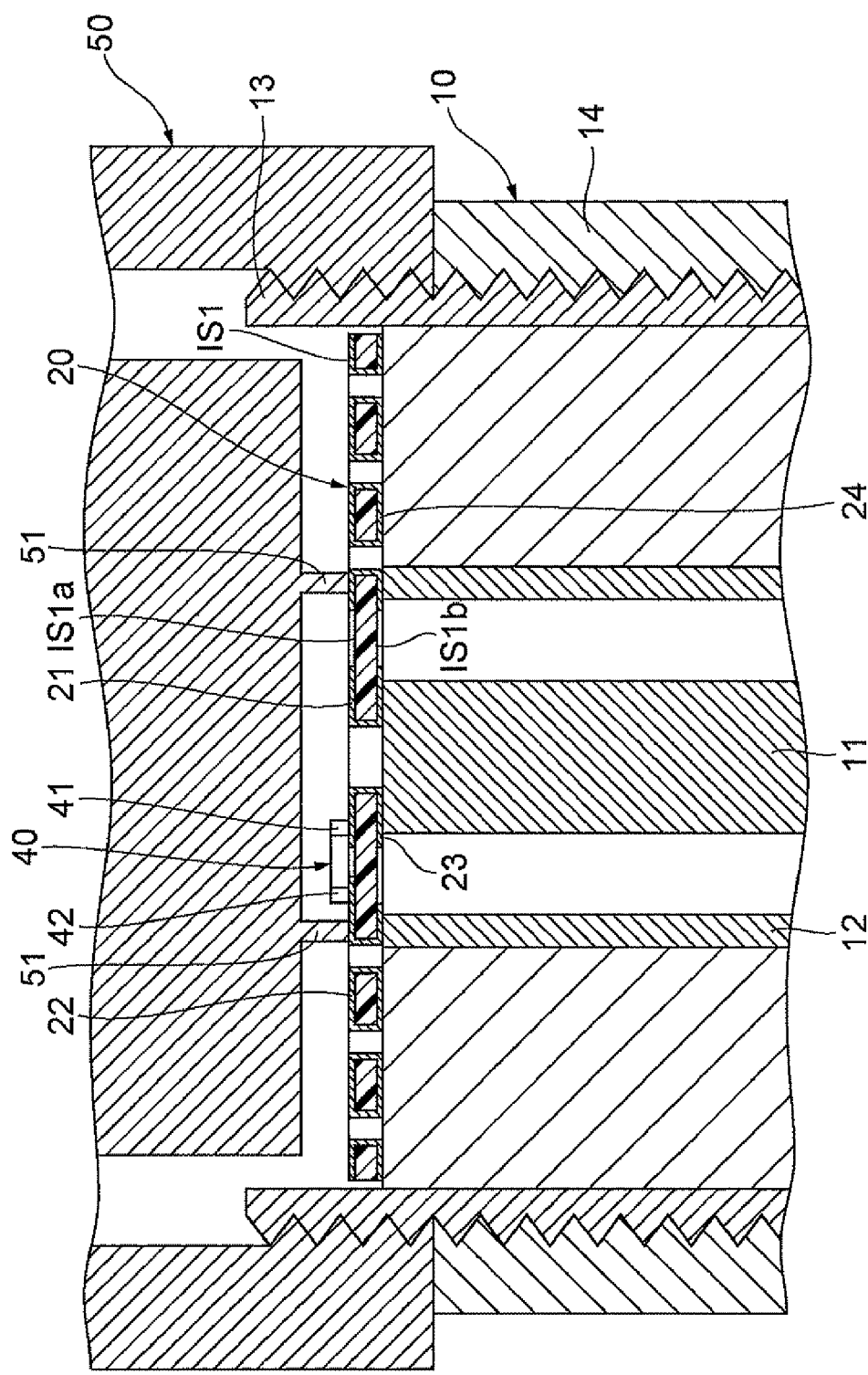
FIG. 12 is a drawing showing a state in which the measurement substrate is pushed by the fixture.

Next, impedance measurement of the measured electronic component 40 by the impedance measuring device 1 will be described with reference to FIGS. 9 to 12. The present embodiment provides an example in which the measured electronic component 40 is a multilayer chip capacitor. In FIGS. 9, 11, and 12, the insulating coating 25 is omitted from the illustration.

First, prior to the measurement, the measured electronic component 40 is mounted on the measurement substrate 20. This step results in fixing the measured electronic component 40 to the measurement substrate 20. The measured electronic component 40 has a pair of terminal electrodes 41, 42. In a state in which the measured electronic component 40 is mounted on the measurement substrate 20, one terminal electrode 41 is electrically connected to the first and third conductors 21, 23 and the other terminal electrode 42 is electrically connected to the second and fourth conductors 22, 24.

Figure 10:
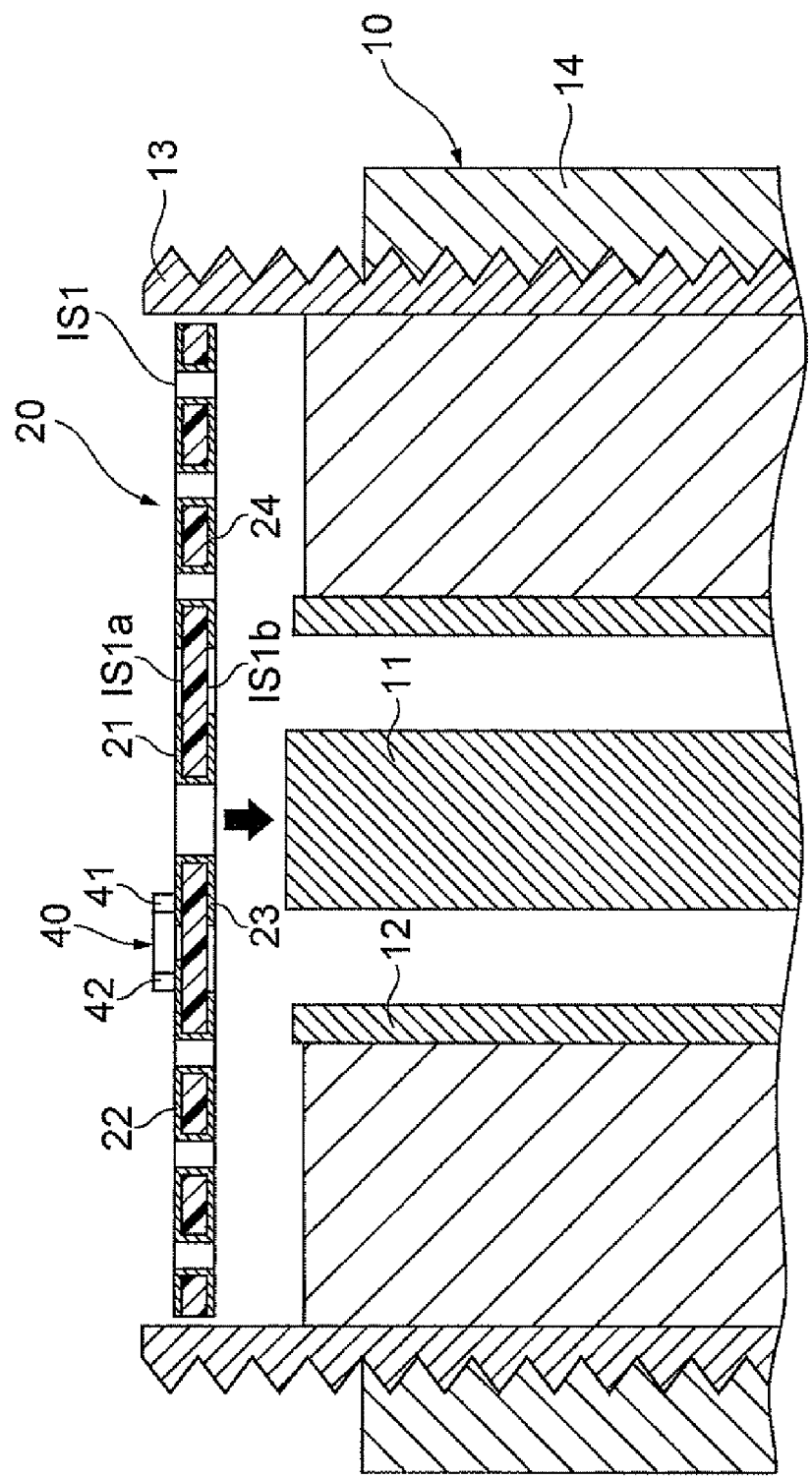
FIG. 10 is a drawing showing a state in which the measurement substrate is being housed into the coaxial connector.

Next, as shown in FIGS. 9 and 10, the measurement substrate 20 with the measured electronic component 40 being mounted thereon is housed into the coaxial connector 10. On this occasion, the measurement substrate 20 is housed in the sleeve 13 of the coaxial connector 10 so that the second principal surface IS1b (third and fourth conductors 23, 24) is opposed to the center conductor 11 and the outer conductor 12 of the coaxial connector 10.

Then, as shown in FIGS. 11 and 12, the measurement substrate 20 is pushed by a fixture 50 to mesh with the sleeve 13 of the coaxial connector 10. The fixture 50 has a push portion 51. The push portion 51 is of a nearly cylindrical shape. The inside diameter of the push portion 51 is set to a value larger than a length from the center of the insulating substrate IS1 to the mounting portion 22a so that the measured electronic component 40 is positioned inside the push portion 51. The height of the push portion 51 is set to a value larger than the height of the measured electronic component 40 so as to avoid contact with the measured electronic component 40.

The push portion 51 is in surface contact with the second conductor 22 of the measurement substrate 20 to push the measurement substrate 20. At this time, the third conductor 23 of the measurement substrate 20 is brought into surface contact with the center conductor 11 of the coaxial connector 10 to be electrically connected thereto; the fourth conductor 24 of the measurement substrate 20 is brought into surface contact with the outer conductor 12 of the coaxial connector 10 to be electrically connected thereto. In a state in which the measurement substrate 20 is housed in the coaxial connector 10 and pushed by the fixture 50, the center conductor 11 of the coaxial connector 10 is electrically connected to one terminal electrode 41 through the third conductor 23, throughhole conductor 26, and first conductor 21 (mounting portion 21a). The outer conductor 12 of the coaxial connector 10 is electrically connected to the other terminal electrode 42 through the fourth conductor 24, throughhole conductors 27, and second conductor 22 (mounting portion 22a).

Next, the impedance characteristic of the measured electronic component 40 is measured using the impedance measuring device 1 (E4991A RF Impedance/Material Analyzer). In general, the RF I-V method is applied as an impedance measuring technique. The RF I-V method is well-known, for example, as described in the impedance measurement handbook (November, 2003 version) published by Agilent Technologies Japan, Ltd. and the detailed description thereof is omitted herein.

Short calibration in the impedance measuring device 1 will be described below with reference to FIGS. 13 and 14.

Figure 13:
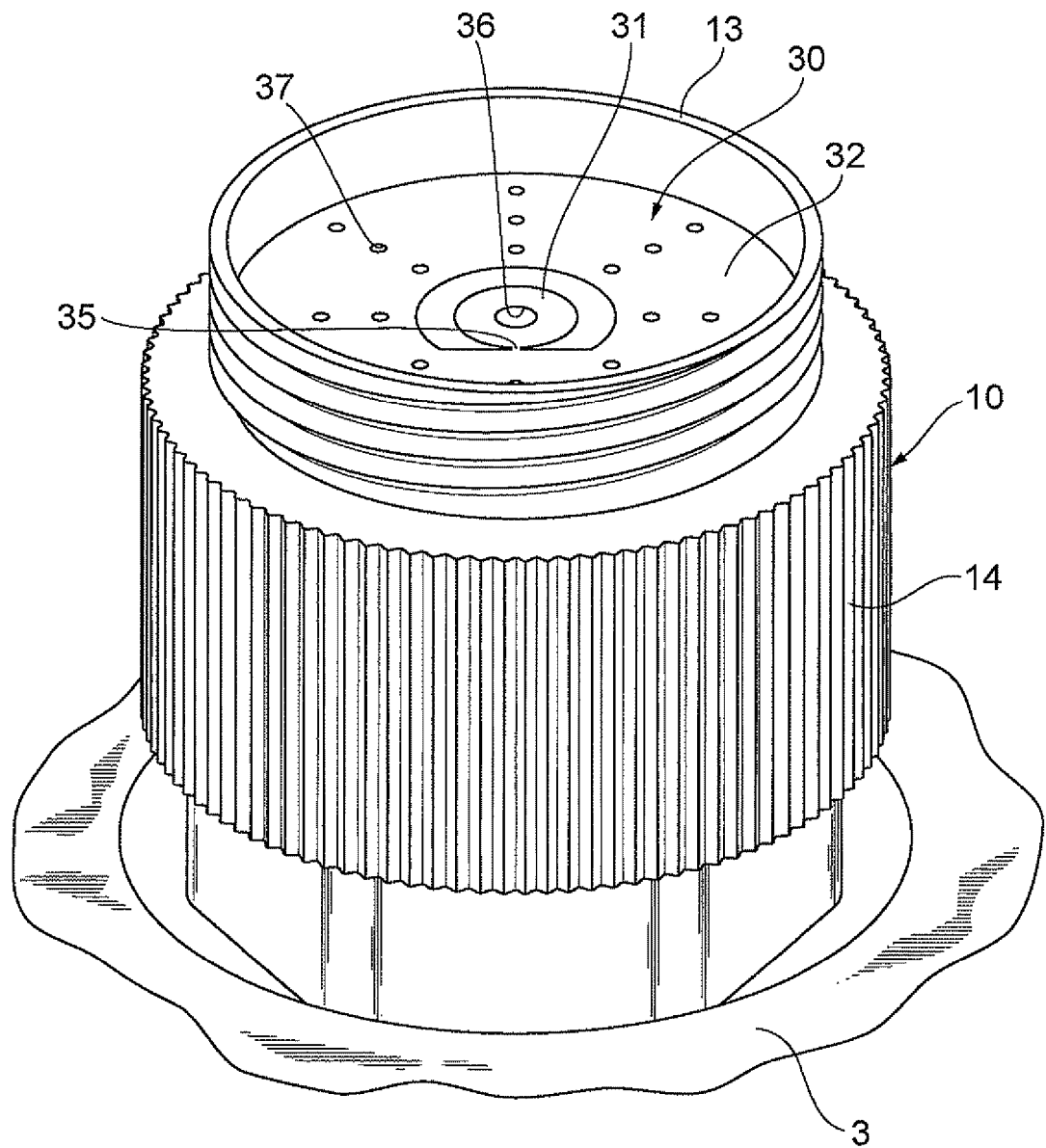
FIG. 13 is a perspective view showing a state in which the short substrate is housed in the coaxial connector.
Figure 14:
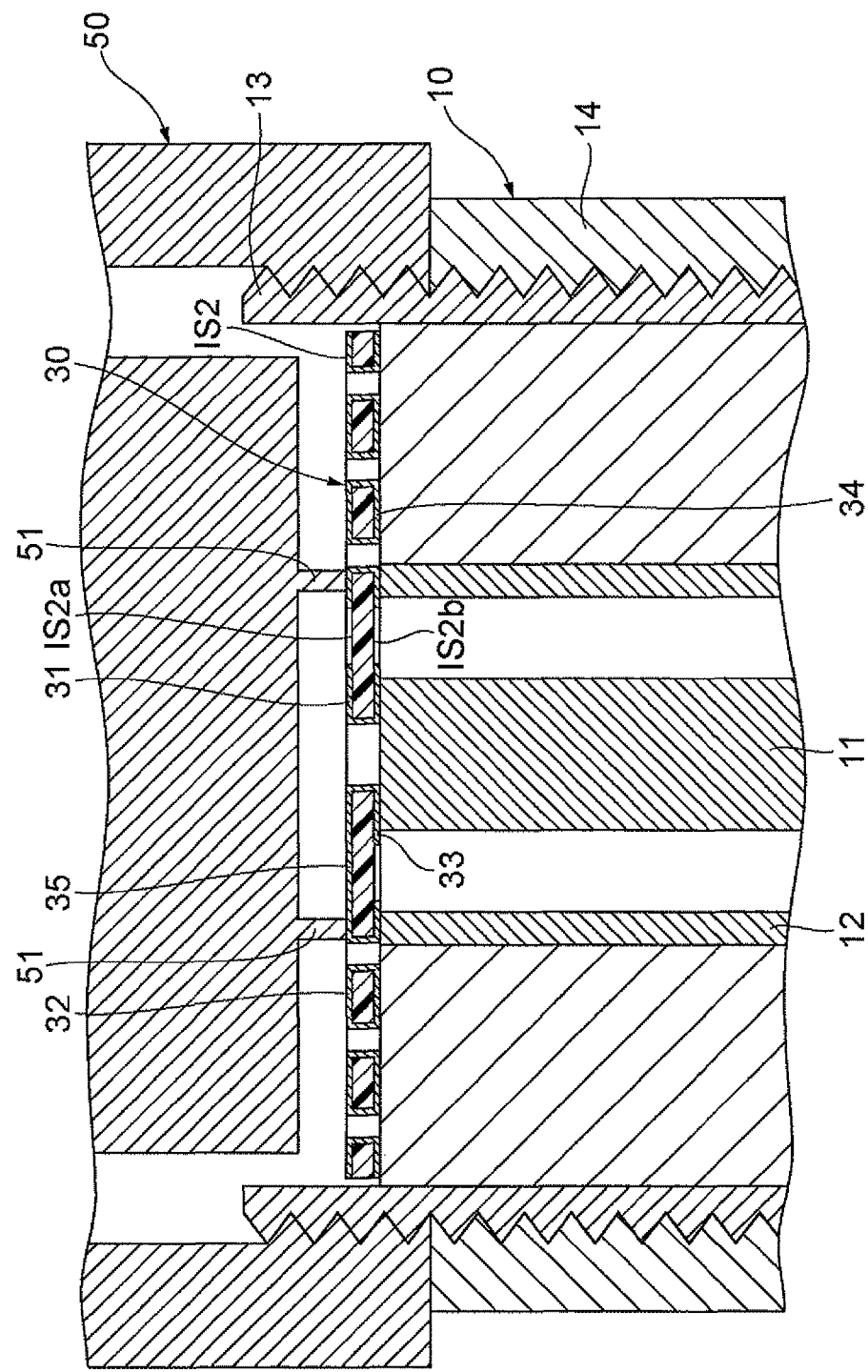
FIG. 14 is a drawing showing a state in which the short substrate is pushed by the fixture.

As shown in FIGS. 13 and 14, the short substrate 30 is housed into the coaxial connector 10. On this occasion, the short substrate 30 is housed in the sleeve 13 of the coaxial connector 10 so that the second principal surface IS2b (third and fourth conductors 33, 34) is opposed to the center conductor 11 and the outer conductor 12 of the coaxial connector 10.

Then the short substrate 30 is pushed by the fixture 50 to mesh with the sleeve 13 of the coaxial connector 10. The push portion 51 is in surface contact with the second conductor 32 of the short substrate 30 to push the short substrate 30. At this time, the third conductor 33 of the short substrate 30 is brought into surface contact with the center conductor 11 of the coaxial connector 10 to be electrically connected thereto; the fourth conductor 34 of the short substrate 30 is brought into surface contact with the outer conductor 12 of the coaxial connector 10 to be electrically connected thereto. In a state in which the short substrate 30 is housed in the coaxial connector 10 and pushed by the fixture 50, the center conductor 11 and the outer conductor 12 of the coaxial connector 10 are electrically connected to each other through the third conductor 33, throughhole conductor 36, first conductor 31, fifth conductor 35, second conductor 32, throughhole conductors 37, and fourth conductor 34.

Thereafter, the short calibration in the impedance measuring device 1 is carried out. Since the technique of short calibration in the impedance measuring device 1 is also well-known, the detailed description thereof is omitted herein.

In the present embodiment, as described above, the measured electronic component 40 is mounted on the first and second conductors 21, 22 (mounting portions 21a, 22a) of the measurement substrate 20 to be fixed to the measurement substrate 20, and for this reason, no contact resistance is produced between the measured electronic component 40 and the measurement substrate 20. In addition, it suppresses occurrence of the measurement variation due to the contact resistance. As a consequence of these, the present embodiment permits the impedance characteristic of the measured electronic component 40 to be carried out with high accuracy.

In the present embodiment, the measurement substrate 20 is housed in the sleeve 13 of the coaxial connector 10 so as to make the second principal surface IS1b opposed to the center conductor 11 and the outer conductor 12 and keep the third conductor 23 in surface contact with the center conductor 11 and the fourth conductor 24 in surface contact with the outer conductor 12, whereby the first conductor 21 is electrically connected to the center conductor 11 through the throughhole conductor 26 and the third conductor 23 and whereby the second conductor 22 is electrically connected to the outer conductor 12 through the throughhole conductors 27 and the fourth conductor 24. In this configuration, the measured electronic component 40 is mounted on the side of first principal surface IS1a where it does not face the coaxial connector 10 (center conductor 11 and outer conductor 12), which can surely prevent a short between the center conductor 11 and the outer conductor 12 due to contact between the measured electronic component 40 and the coaxial connector 10. Since the measured electronic component 40 does not exist on the side of second principal surface IS1b, it does not interfere with contact between the third conductor 23 and the center conductor 11 and contact between the fourth conductor 24 and the outer conductor 12. As a result of this arrangement, it is feasible to ensure secure contact between the third conductor 23 and the center conductor 11 and secure contact between the fourth conductor 24 and the outer conductor 12.

A contact resistance is produced between the third conductor 23 and the center conductor 11 and between the fourth conductor 24 and the outer conductor 12. However, since the third conductor 23 is in surface contact with the center conductor 11 and the fourth conductor 24 is in surface contact with the outer conductor 12, the contact resistance produced is relatively small and variation thereof is also small. As a result of this, influence is extremely small on the measurement of the impedance characteristic of measured electronic component 40 and degradation of measurement accuracy is restrained.

In the present embodiment, the second conductor 22 is pushed by the fixture 50 to mesh with the sleeve 13 of the coaxial connector 10. This configuration can further decrease the variation in the contact resistance between the third conductor 23 and the center conductor 11 and between the fourth conductor 24 and the outer conductor 12. Particularly, the present embodiment adopts the configuration wherein the end of the center conductor 11 is more projecting than the end of the outer conductor 12, which increases the pressing force by the fixture 50 (push portion 51); this ensures secure surface contact between the third conductor 23 and the center conductor 11 and secure surface contact between the fourth conductor 24 and the outer conductor 12.

In the present embodiment, the insulating coating 25 with the apertures 25a to expose the mounting portions 21a, 22a of the first and second conductors 21, 22 is formed on the side of first principal surface IS1a of the measurement substrate 20. In this case, the measured electronic component 40 can be readily positioned during mounting the measured electronic component 40 on the measurement substrate 20.

In the present embodiment, the short substrate 30 is housed in the sleeve 13 of the coaxial connector 10 so that the first conductor 31 and the center conductor 11 are electrically connected to each other and so that the second conductor 32 and the outer conductor 12 are electrically connected to each other, and the short calibration is carried out in the impedance measuring device 1. When the short calibration is carried out using the short substrate 30 having the shape similar to that of the measurement substrate 20, the short calibration is carried out under a condition closely similar to the condition for execution of the impedance measurement of the measured electronic component 40. Therefore, the calibration result is appropriately reflected in execution of the impedance measurement of the measured electronic component 40, whereby the impedance characteristic of the measured electronic component 40 can be measured with higher accuracy.

Open calibration in the impedance measuring device 1 can be carried out using the measurement substrate 20 without mounting the measured electronic component 40 thereon. The measurement substrate 20 without the measured electronic component 40 is housed into the sleeve 13 of the coaxial connector 10 to electrically connect the first conductor 21 to the center conductor 11 and electrically connect the second conductor 22 to the outer conductor 12. Thereafter, the open calibration is carried out in the impedance measuring device 1. When the open calibration is carried out using the measurement substrate 20, the open calibration is carried out under a condition closely similar to the condition for execution of the impedance measurement of the measured electronic component 40. Therefore, the calibration result is appropriately reflected in execution of the impedance measurement of the measured electronic component 40, whereby the impedance characteristic of the measured electronic component 40 can be measured with higher accuracy.

The above described the preferred embodiment of the present invention, but it should be noted that the present invention is by no means limited to the above-described embodiment but can be modified in various ways without departing from the scope and spirit of the invention.

In the present embodiment, the measurement substrate 20 is housed in the coaxial connector 10 so that the second principal surface IS1b is opposed to each of the conductors 11, 12 of the coaxial connector 10, but the present invention is not limited only to it. The measurement substrate 20 may also be housed in the coaxial connector 10 so that the first principal surface IS1a is opposed to each of the conductors 11, 12 of the coaxial connector 10, as long as direct contact can be avoided between the measured electronic component 40 mounted on the measurement substrate 20 and each of the conductors 11, 12 of the coaxial connector 10. In this case, the measurement substrate 20 does not have to be provided with the third and fourth conductors 23, 24.

The first conductor 21 and the second conductor 22 are concentrically arranged, but the present invention is not limited only to this arrangement. The first conductor 21 and the second conductor 22 may be any shape as long as they are electrically insulated from each other on the first principal surface IS1a. The third conductor 23 and the fourth conductor 24 are also concentrically arranged, but the present invention is not limited only to this arrangement. The third conductor 23 and the fourth conductor 24 may be any shape as long as they are electrically insulated from each other on the second principal surface IS1b.

In the present embodiment the impedance measuring device 1 and the coaxial connector 10 are electrically connected to each other through the test head unit 3, but the present invention is not limited only to this connection. For example, the impedance measuring device 1 and the coaxial connector 10 may be electrically connected to each other through a coaxial cable.

The present invention is also applicable to the impedance measuring method of any electronic component (e.g., an inductor, resistor, filter, etc.) other than the multilayer chip capacitor.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An impedance measuring method using:
   an impedance measuring device for measuring an impedance of a measured electronic component;
   a coaxial connector having a center conductor and an outer conductor located outside the center conductor, and being electrically connected to the impedance measuring device; and
   a measurement substrate which can be housed in the coaxial connector, said measurement substrate having an insulating substrate, and first and second conductors each formed on a first principal surface of the insulating substrate,
   said impedance measuring method comprising:
   housing the measurement substrate with the measured electronic component being mounted on the first and second conductors, in the coaxial connector connected to the impedance measuring device, so that the first conductor is electrically connected to the center conductor and so that the second conductor is electrically connected to the outer conductor; and
   measuring the impedance of the measured electronic component by the impedance measuring device.

2. The impedance measuring method according to claim 1, wherein the measurement substrate further has a third conductor and a fourth conductor each formed on a second principal surface of the insulating substrate, the third conductor is electrically connected through a through-hole conductor to the first conductor, and the fourth conductor is electrically connected through a through-hole conductor to the second conductor, and wherein the measurement substrate is housed in the coaxial connector so as to make the second principal surface opposed to the center conductor and the outer conductor and keep the third conductor in surface contact with the center conductor and the fourth conductor in surface contact with the outer conductor, whereby the first conductor is electrically connected through the third conductor to the center conductor and whereby the second conductor is electrically connected through the fourth conductor to the outer conductor.

3. The impedance measuring method according to claim 2, further comprising using a fixture to mesh with the coaxial connector, wherein the second conductor is pushed by the fixture.

4. The impedance measuring method according to claim 2, wherein an insulating coating is formed on the first principal surface side of the measurement substrate, and wherein the insulating coating has apertures formed so as to expose portions in the first and second conductors where the measured electronic component is to be mounted.

5. The impedance measuring method according to claim 1, further using a short substrate having a shape similar to that of the measurement substrate, in which a short circuit is made between a conductor corresponding to the first conductor and a conductor corresponding to the second conductor, said impedance measuring method comprising:

housing the short substrate in the coaxial connector so that the conductor corresponding to the first conductor is electrically connected to the center conductor and so that the conductor corresponding to the second conductor is electrically connected to the outer conductor; and performing short calibration by the impedance measuring device.

* * * * *